(12) United States Patent
Genest

(10) Patent No.: US 9,106,228 B2
(45) Date of Patent: Aug. 11, 2015

(54) ADAPTIVE MOS TRANSISTOR GATE DRIVER AND METHOD THEREFOR

(71) Applicant: Semiconductor Components Industries, LLC, Phoenix, AZ (US)

(72) Inventor: Pierre Andre Genest, Lafitte Vigordane (FR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/259,976

(22) Filed: Apr. 23, 2014

(65) Prior Publication Data

US 2014/0375376 A1    Dec. 25, 2014

Related U.S. Application Data

(60) Provisional application No. 61/838,301, filed on Jun. 23, 2013.

(51) Int. Cl.
*H03K 19/0185* (2006.01)
*H03K 17/16* (2006.01)

(52) U.S. Cl.
CPC ...... *H03K 17/162* (2013.01); *H03K 2217/0009* (2013.01); *H03K 2217/009* (2013.01); *H03K 2217/0036* (2013.01)

(58) Field of Classification Search
USPC .......... 327/108, 538, 540–541, 543, 544; 363/59–60
See application file for complete search history.

(56) References Cited

U.S. PATENT DOCUMENTS 5,426,334 A * 6/1995 Skovmand ............ 327/427
7,821,328 B2 * 10/2010 Hoque et al. ......... 327/536
8,487,689 B2 7/2013 Floyd

OTHER PUBLICATIONS

Maxim, "Regulated, 125mA-Output, Charge-Pump DC-DC Inverter", data sheet, Copyright 1998 Maxim Integrated products, 8 pages.
A2IC APTUS, "APTUS Ultra-Small, Low Input Voltage, Low rON Load Switch", Data Sheet, A2IC-APS1001-1—Preliminary Information May 2011, 6 pages.
Chen Mingyang et al, Institute of VLSI Design, Zhejiang University, "Novel High Efficiency Low Ripple Charge Pump Using Variable Frequency Modulation", 22nd International Conference on Microelectronics (ICM 2010), Copyright 2009 IEEE, 4 pages.

* cited by examiner

*Primary Examiner* — An Luu
(74) *Attorney, Agent, or Firm* — Robert F. Hightower

(57) ABSTRACT

In an embodiment, a gate driver circuit and/or method therefor may include configuring the gate driver circuit form a drive current to supply to a gate of an MOS transistor wherein the value of the drive current is a minimum value that can be supplied to the gate without increasing a charge stored on a gate-to-source capacitance of the MOS transistor; configuring the gate driver circuit to change the value of the drive current responsively to changes of a Vgs of the MOS transistor.

20 Claims, 3 Drawing Sheets

US 9,106,228 B2

ADAPTIVE MOS TRANSISTOR GATE DRIVER AND METHOD THEREFOR

PRIORITY CLAIM TO PRIOR PROVISIONAL FILING

This application claims priority to prior filed Provisional Application No. 61/838,301 entitled "ADAPTIVE MOS TRANSISOTR GATE DRIVER AND METHOD THEREFOR" filed on Jun. 23, 2013, and having common inventor Pierre Andre Genest, which is hereby incorporated herein by reference.

BACKGROUND OF THE INVENTION

The present invention relates, in general, to electronics, and more particularly, to semiconductors, structures thereof, and methods of forming semiconductor devices.

In the past, the electronics industry utilized various methods and apparatus to form drives for transistors, for example for metal oxide semiconductor (MOS) transistors. Power consumption was one parameter that was used to evaluate transistors for some analog circuits. It defines the electrical power required by the circuit to be functional. For example, the quiescent power consumption for a load switch corresponds to the energy required to keep the switch turned-on. MOS based load switches were known for having low quiescent power consumption since the MOS transistor did not require additional power once the gate-source capacitance of the MOS transistor was charged. Nevertheless, quiescent current was not zero because of leakage currents and specific additional features. The quiescent current could even be relatively high in case of N-channel MOS based switches.

P-channel MOS transistors were preferred when very low quiescent current was desired and N-channel MOS switches were chosen when very low on resistance was desired.

Accordingly, it is desirable to have a method and/or apparatus that reduces the quiescent power dissipation of N-channel MOS switches.

Figure 1:
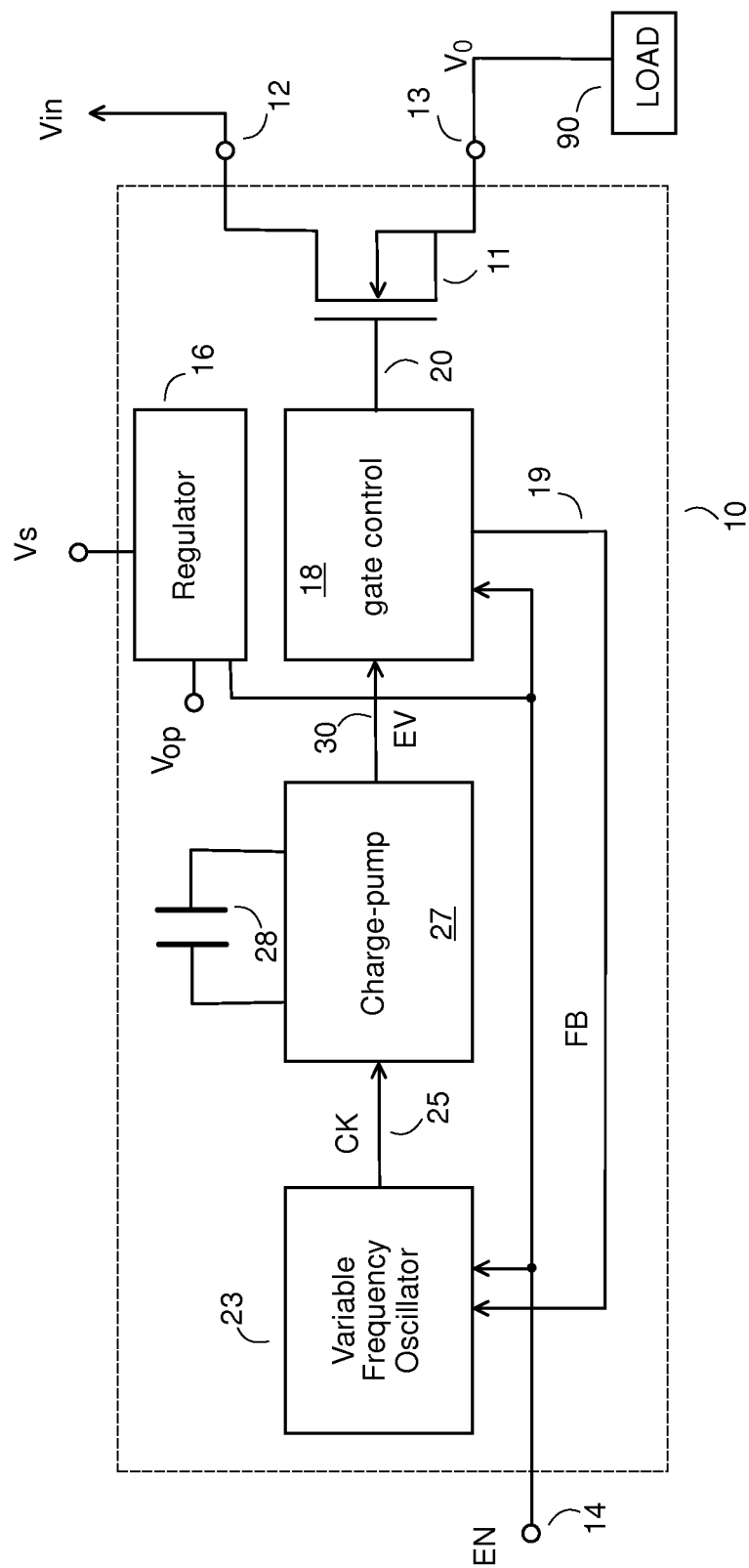
FIG. 1 schematically illustrates an example of an embodiment of a portion of an adaptive MOS gate driver circuit in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

DETAILED DESCRIPTION OF THE DRAWINGS

FIG. 1 schematically illustrates an example of an embodiment of a portion of an adaptive MOS gate driver circuit 10 that is configured to from a drive signal 20 to drive a gate of a semiconductor switch and supply an output voltage (Vo) to a load 90. In one non-limiting example, the semiconductor switch may be an MOS transistor for example an N-channel MOS transistor 11. Transistor 11 may be configured to provide a load current to load 90 including the case of providing a current to charge a battery. In one embodiment, circuit 10 includes a switching DC to DC converter controlled by a variable frequency oscillator, and also includes a gate voltage control circuit that is configured to maximize a gate-to-source voltage (Vgs) of an MOS transistor at a minimum operating frequency of the switching DC to DC converter. An embodiment includes maximizing the Vgs to minimize the on-resistance of the MOS transistor. In an embodiment, the switching DC to DC converter may be a charge pump circuit.

In some systems, it may be desirable to bias the gate of an N-channel MOS (NMOS) transistor at higher voltage than its source plus a conduction threshold (Vcth) of the transistor to fully enable the transistor. In the case of load switches, this may limit the use of the input voltage to bias the gate thus it may be desirable to have a circuit to increase the value of the signal that is applied to the gate. Those skilled in the art will understand that such conditions are applicable to transistors that are operated in a continuous mode, as opposed to a switched mode, to supply a load current to a load. Such transistors are sometime referred to as series pass transistors. The method may also be applicable to transistors that are switched, such as switched from a PWM drive signal.

In some systems, a charge pump may be used to provide an increased voltage to a gate of a transistor. The charge pump may be driven by a clock signal. A doubler type of charge pump may provide an output voltage approximately equal to a voltage of two times an input voltage in series with an output resistor. One embodiment may include the resistor may be approximately equal to 1/C*F where C represents the charge-pump flying capacitor and F the switching frequency of the charge pump. When the operating voltage decreases, it may be necessary to use a higher multiplication factor.

The gate capacitance, such as the gate-to-source capacitance (Cgs) for example, of an MOS transistor usually is directly proportional to the width and length of the transistor. These parameters typically are derived from specified on-state resistance and by its off-state leakage current. The gate capacitance and specified switch-on time may define the charge-pump output resistance. The maximum value of the charge-pump's Rout may define the minimum value of operating frequency and flying capacitor(s). This parameter may influence the power consumption.

In one embodiment, it may be desirable to have a method and/or apparatus that reduces the quiescent power dissipation. An embodiment may include that it is desirable to control an N-channel MOS switch, such as for example transistor 11, in a manner that reduces a quiescent power dissipation to be closer to that of a P-channel MOS switch.

In one embodiment, circuit 10 may include a variable frequency oscillator (VFO) circuit or oscillator 23, a charge pump circuit or charge pump 27, and a power MOS gate control circuit or control circuit 18. A capacitor 28 illustrates in a general manner a flying capacitor of charge pump 27. Those skilled in the art will appreciate that the number of flying capacitors depends on the multiplication factor of charge pump 27. In a non-limiting example embodiment, the charge pump 27 may be configured to operate with an adaptive frequency. An embodiment may include that the charge-pump may be configured to operate with a frequency that can vary instead of operating at a fixed frequency. An embodiment may include configuring the VFO 23 to provide a clock (CK) signal or clock 25 to the charge pump 27. The charge pump 27 may be configured to form an output voltage, such as an elevated voltage (EV) signal 30 for example, and/or may supply an output current to allow circuit 18 to form the drive signal to drive the gate of transistor 11. An embodiment may include configuring circuit 18 to provide a feedback (FB) signal to the oscillator 23 to modulate the frequency of the clock (CK) signal 25. An embodiment may include configuring the VFO to change a frequency of the clock signal responsively to the feedback (FB) signal from circuit 18. In a non-limiting example embodiment, the VFO and the charge-pump may not be switched off when circuit 10 is on, but may operate in a steady state with the clock signal at very low frequency. An embodiment of circuit 10 may include an optional internal regulator 16 that is configured to form an internal operating voltage (Vop) that may be used as the supply voltage for operating some of circuits 18, 23, and/or 27.

An embodiment may include configuring circuit 10 to control the clock signal frequency responsively to a difference between a gate-to-source voltage (Vgs) of transistor 11 and a desired value. In an embodiment, circuit 10 may be configured to adjust the frequency of the clock signal responsively to a difference between the Vgs of transistor 11 and a first threshold value.

In one non-limiting example embodiment, circuit 23 may be configured to form the frequency of CK signal 25 responsively to the Vgs of transistor 11. For example, the frequency may be inversely related so that an increase in the value of Vgs reduces the frequency. In another non-limiting example embodiment, circuit 23 may be configured to form the frequency of CK signal 25 responsively to the FB signal. For example, inversely related. In other embodiments, the signals may be directly related instead of inversely related. In one non-limiting example embodiment, circuit 27 may be configured to form the value of EV signal 30 responsively to the Vgs of transistor 11. For example the value of EV signal 30 may be inversely related so that an increase in the value of Vgs decreases the voltage of EV signal 30. In another non-limiting example embodiment, circuit 27 may be configured to form the value of EV signal 30 responsively to the value of the FB signal. For example the value of EV signal 30 may be inversely related so that an increase in the value of the FB signal decreases the voltage of EV signal 30. In another non-limiting example embodiment, circuit 27 may be configured to form the value of EV signal 30 responsively to the frequency of CK signal 25. For example the value of EV signal 30 may be directly related so that an increase in the frequency of CK signal 25 increases the voltage of EV signal 30.

In another non-limiting example embodiment, circuit 10 may be configured to form the frequency of the clock signal 25 at maximum frequency during a startup and ramp-up phase. An embodiment may include configuring circuit 10 to decrease the frequency of the clock signal responsively to Vgs having a value that is no less than the first threshold. One non-limiting example embodiment may include forming the first threshold to not exceed a value that is set by the limit of the process used to form transistor 11. A non-limiting example may include forming the first threshold so that process limits are not exceeded. In an embodiment, circuit 10 is configured to form the clock signal at a minimum frequency responsively to the output of the charge pump substantially equaling miscellaneous leakage currents. A non-limiting example embodiment may include that the miscellaneous leakage currents have a value that is substantially equal to the leakage currents of circuit 18 and/or charge pump 27. A non-limiting example embodiment may include that the miscellaneous leakage currents have a value that includes any leakage current that may be present in transistor 11. An embodiment includes configuring circuit 10 to vary the frequency of the clock (CK) signal 25 responsively to variations of the Vgs of transistor 11. An embodiment may include configuring circuit 10 to vary the frequency of clock (CK) signal 25 responsively to variations of the Vgs of transistor 11 for value of Vgs that are no less than the first threshold value.

In one non-limiting embodiment, the clock generator frequency may be continuously adjusted to the minimum value needed to bring and keep Vgs within a desired voltage range. Circuit 10 may be configured to modulate the VFO frequency and/or the frequency of CK signal 25 to keep Vgs at a maximum voltage which just compensates the leakage current of circuit 10. In one example embodiment, the leakage currents of circuit 18 and/or charge pump 27. A non-limiting example embodiment may include that the leakage currents have a value that includes any leakage current that may be present in transistor 11. The charge-pump may start at maximum frequency to assist in providing a specified switch-on time. A feedback (FB) signal may be sent back to the VFO when Vgs is close to the maximum allowed Vgs voltage to lower the operating frequency and to reduce the current provided by the charge pump. The minimum frequency may be reached when the charge pump output current is a value that is substantially equal to the miscellaneous leakage currents without increasing the gate charge of transistor 11.

In an embodiment, circuit 10 is configured to adjust the steady state charge-pump frequency responsively to operating conditions of transistor 11 to minimize the power consumption while transistor 11 has the optimum Vgs voltage. In an embodiment, circuit 10 may be configured to form drive signal 20 to drive the gate of transistor 11 from the charge pump which is operated at a frequency which continuously decreases when the Vgs voltage of transistor 11 approaches a threshold. In one non-limiting example, the conduction threshold (Vcth) may be the transistor's conduction threshold voltage for the drain-to-source current conducted by the transistor.

Figure 2:
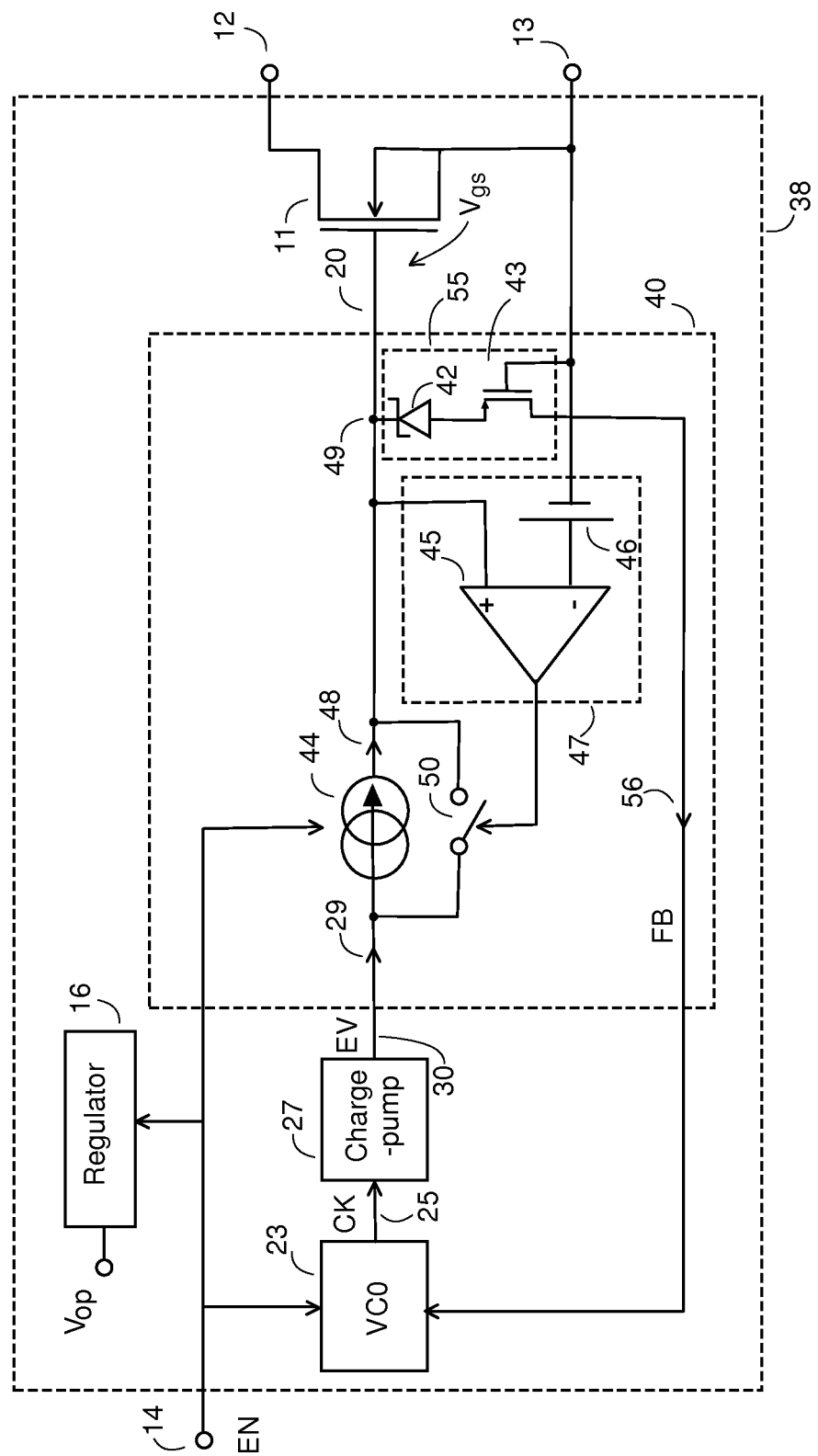
FIG. 2 schematically illustrates a non-limiting example embodiment of a gate control circuit that may be an alternate embodiment of the gate control circuit described in the description of FIG. 1 in accordance with the present invention.

FIG. 2 schematically illustrates an example of an embodiment of a portion of an adaptive MOS gate driver circuit or driver circuit 38 that is an alternate embodiment of driver circuit 10 described in the description of FIG. 1. Circuit 38 may be similar to circuit 10 and may be configured to function similarly to circuit 10. Circuit 38 includes a non-limiting example embodiment of a gate control circuit 40 that may be an alternate embodiment of circuit 18 described in the description of FIG. 1. Circuit 40 may be similar to and may be configured to operate similarly to circuit 18 of FIG. 1. In one embodiment, circuit 40 may be configured to receive an optional enable signal (EN) and to enable circuit 40 to form drive signal 20 responsively to a first state of the enable signal. An embodiment may include forming circuit 40 to include a current source 44 that may be configured to form a current 48 to charge a capacitance of a power switch. In a non-limiting example embodiment, the power switch may be transistor 11.

An example embodiment of circuit 40 may include a switch 50 coupled in parallel with source 44, a second threshold detect circuit 47, and a feedback circuit 55. Circuit 55 is configured to form the feedback (FB) to be representative of a difference between the Vgs of transistor 11 and a Vgs value that compensates for the leakage current of transistor 11. An embodiment may include that circuit 55 is configured to form the Vgs value that compensates for the leakage current of circuit 55, such as for example the leakage current of circuit 18 and/or charge pump 27. In another embodiment, the FB signal may be representative of a difference between the Vgs of transistor 11 and the first threshold value. A non-limiting example embodiment of circuit 55 may include a zener diode 42 and a transistor 43. Those skilled in the art will appreciate that circuit 55 may have various other embodiments as long as the configuration detects Vgs having a value no less than the first threshold value and forms the FB signal responsively as described herein. For example, circuit 55 may use other reference circuit configurations instead of zener diode 42, and may have of signal generations configurations instead of transistor 43. For example, circuit 55 may include a differential transconductance amplifier that compares Vgs to a reference signal from a reference circuit and forms a current for the FB signal. In an embodiment, circuit 38 may be configured to form the first threshold value at a value of the maximum Vgs for the drain-to-source current conducted by transistor 11. In another embodiment, circuit 38 may be configured so that the minimum frequency of circuit 23 is a frequency that causes circuit 27 to form current 29 at a value that is substantially equal to the miscellaneous leakage currents, such as for example any leakage currents of transistor 11, without increasing gate charge of transistor 11. A non-limiting example embodiment of second threshold detect circuit 47 may include a comparator 45 and may also include a reference 46 that is configured to form a signal that is representative of the second threshold value. Those skilled in the art will appreciate that circuit 47 may have various other embodiments as long as the configuration detects Vgs having a value no less than the second threshold value and forms a signal representing that the condition has been detected.

An embodiment may include configuring circuit 40 to provide a first current, for example current 48, from circuit 40 to the gate of transistor 11 responsively to a Vgs value that may be no greater than a second threshold value, and to supply a second current, for example current 29, to the gate of transistor 11 responsively to a Vgs value that may be greater than the second threshold value. An embodiment may include configuring circuit 40 to provide a first current from selectively enabled current source 44 to the gate of transistor 11 responsively to a Vgs value that may be no greater than the second threshold value. An embodiment may include configuring circuit 40 to provide a second current from the charge-pump 27 to the gate of transistor 11 responsively to a Vgs value that may be greater than the second threshold value. In an embodiment, the optional enable signal may enable current source 44 to supply the current from circuit 40 and so that the current may charge the gate capacitance of transistor 11. An embodiment may include configuring circuit 40 to form the feedback (FB) signal responsively to a Vgs value that may be no less than the first threshold value. An embodiment may include configuring circuit 40 to compare Vgs to a voltage from a reference circuit to determine the relationship to the first threshold value.

An embodiment may include configuring circuit 40 to compare Vgs to a voltage formed by a zener diode and a P-channel MOS transistor to determine the relationship to the second threshold value. A non-limiting example embodiment may include using a Vgs of the P-channel transistor for the P-channel MOS transistor's portion of the first threshold value. Another embodiment may include configuring circuit 40 to compare the Vgs of transistor 11 with a zener diode threshold voltage to form the feedback signal.

In one embodiment, the first threshold value may be larger than the second threshold value. In another embodiment, the second threshold value may be larger than the first threshold value. In another embodiment, the first threshold value may be substantially equal to the second threshold value.

In an embodiment, the VFO 23 may be configured to adjust the frequency of the clock signal 25 responsively to the feedback (FB) signal. Another embodiment may include configuring the VFO to adjust the frequency responsively to the current flowing through transistor 43 in series with the zener diode. This current may be subtracted from the VFO internal bias current to adjust the frequency. In an embodiment, the VFO may be configured to reduce the clock signal frequency responsively to a Vgs value greater than the first threshold value. An embodiment may include a comparison which improves the overall behavior of the loop (stability and spike filtering) but does not directly interfere with the frequency control. Comparator 45 may have various other alternate embodiments instead of the differential amplifier illustrated in FIG. 2, including simple transistor(s) implementation. For example, a Vgs of a transistor may be used to form the comparison.

Figure 3:
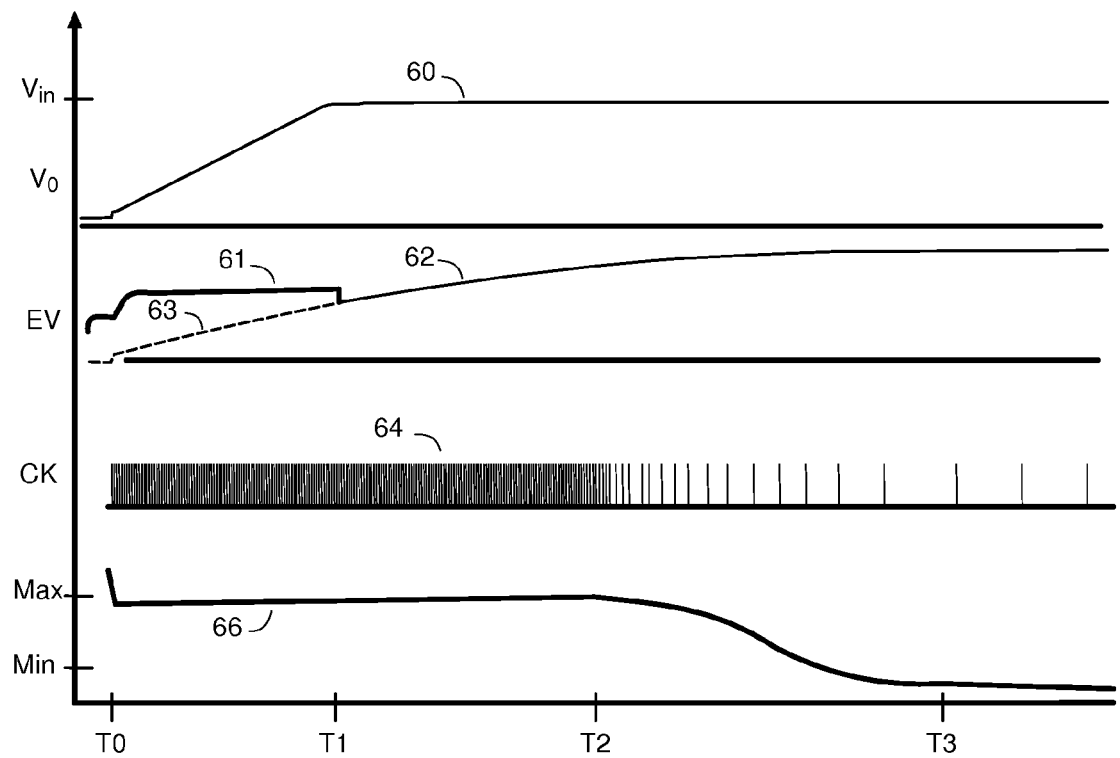
FIG. 3 is a graph having plots that illustrate some signals of an example embodiment of the circuit of FIG. 1 and/or FIG. 2 in accordance with the present invention.

FIG. 3 is a graph having plots that illustrate some signals formed by an example embodiment of circuit 10 and/or circuit 38. The abscissa indicates time and the ordinate indicates increasing value of the illustrated signal. A plot 60 illustrates an example of an embodiment of the output voltage (Vo) on output terminal or output 13. A plot 61 illustrates one example of EV signal 30 for Vgs value that are less than the second threshold value, and a plot 62 illustrates one example of EV signal 30 for Vgs value that are no less than the second threshold value. A plot 63 illustrates in dashed lines one example of the voltage applied to the gate of transistor 11, such as during the time that Vgs is less than the second threshold. After the second threshold, the Vgs may be approximately the value of EV 30. A plot 64 illustrates an example of clock signal 25. Those skilled in the art will appreciate that clock signal 25 is illustrated as short pulses for simplicity of the illustration, but signal 25 may have various on-time ratios and in some embodiments may have a 50-50 duty cycle where the asserted time is substantially equal to the negated time. A plot 66 illustrates some different relative frequencies of clock signal 25. This description has references to FIG. 2 and FIG. 3. Assume that at a time T0 (FIG. 3) circuit 40 is beginning operation and the Vgs of transistor 11 is at a value that is insufficient to enable transistor 11 to conduct. For example, below a value of the conduction threshold (Vcth) of transistor 11. Thus, the output voltage (Vo) on output 13 has a low value. Also, assume that the optional enable (EN) signal on input 14 is asserted. Oscillator 23 is operating and forms clock (CK) signal 25 to cause circuit 27 to form EV signal 30. The value of the Vgs of transistor 11 typically is less than the second threshold value which causes the output of comparator 45 to be negated and open switch 50. For example, Vgs may be less than the value of the signal from reference 46. Vgs typically is also less than the first threshold value of circuit 55 which causes the FB signal to be a very low value. Because circuit 23 forms the frequency of CK signal 25 responsively to the FB signal, oscillator 23 operates a high-frequency such as illustrated by plots 64 and 66. In one embodiment, circuit 23 operates at a maximum frequency of CK signal 25 in response to the low value of the FB signal. Circuit 27 is configured to form the value of EV signal 30 responsively to the frequency of CK signal 25. Consequently, the high clock frequency causes circuit 27 to supply EV signal 30 with a high voltage value as illustrated by plot 61 of FIG. 3. Current source 44 receives the EV voltage from charge pump 27 and supplies first current 48 to begin charging the gate-to-source capacitance (Cgs) of transistor 11. Current 48 charges Cgs and increases the Vgs of transistor 11 so that transistor 11 begins conducting current causing the output voltage (Vo) to increase as illustrated by plot 60. The Vgs of transistor 11 continues to increase and reduce the on-resistance of transistor 11, and the output voltage (Vo) on output 13 continues to increase and eventually approaches a value of the input voltage (Vin) on input terminal or input 12. For example, the value of Vin minus the drain-to-source voltage of transistor 11.

Vgs eventually reaches the second threshold value, for example near a time T1, and circuit 40 responsively inhibits charging Cgs with first current 48. In one non-limiting example embodiment of circuit 47, reference 46 is configured to form a reference signal that is representative of the second threshold value. For this example embodiment, comparator 45 detects Vgs having a value no less than the second threshold value and asserts a second threshold detect signal on the output of comparator 45. The asserted signal from comparator 45 closes switch 50 and terminates current 48. Charge pump 27 continues to supply second current 29. Current 29 flows through switch 50 to continue charging the Cgs capacitance of transistor 12 and to continue increasing the Vgs. The frequency of clock signal 25 remains at the maximum value. Those skilled in the art will appreciate that circuit 47 may have other embodiments, for example the output of comparator 45 may be used to disable source 44 from forming current 44 instead of, or in addition to, shorting out source 44.

The Vgs of transistor 11 eventually reaches the first threshold value, for example near a time T2, and circuit 55 increases the value of the FB signal responsively to the Vgs of transistor 11. Circuit 55 in configured to detect Vgs having a value that is no less than the first threshold value and increase the FB signal. In one non-limiting example embodiment of circuit 55, a feedback current 56 begins to flow from circuit 55 to oscillator 23 to begin changing the frequency of clock signal 25. In a non-limiting example embodiment, circuit 55 includes a zener diode 42 connected to the gate of transistor 11 and a P-channel MOS transistor 43 having a gate connected to the source of transistor 11. For this example embodiment, the first threshold value is approximately the breakdown voltage or zener voltage of diode 42 plus the Vgs threshold voltage of transistor 43. This example embodiment of circuit 55 is configured to form current 56 responsively to the Vgs of transistor 11 having the value that is no less than the first threshold value. As Vgs increases, current 56 also increases which in turn decreases the oscillator frequency and the frequency of clock 25, for example as illustrated by plots 64 and 66 between times T2 and T3. Reducing the frequency of clock 25 reduces the value of current 29 formed by charge pump 27. Circuit 10 (FIG. 1) and/or circuit 40 is/are configured to continue changing the frequency of clock 25 to cause the Vgs of transistor 11 to be substantially equal to the first threshold value of circuit 55. If any leakage current, such as from transistor 11, causes the Vgs to decrease, circuit 55 decreases current 56 causing an increase in the frequency of clock 25 and a corresponding increase in current 29 and thereby supplying more current to charge the Cgs of transistor 11 and maintain Vgs substantially equal to the first threshold value. In one non-limiting example embodiment, the first threshold value is configured to have a value that maintains Vgs at a maximum allowable value based on the Vgs specifications of transistor 11. For example transistor 11 may have a specification for a maximum Vgs under certain drain and source voltage conditions and/or temperature conditions. The first threshold value is selected to maintain the Vgs of transistor 11 at substantially that maximum allowed value for the particular voltage conditions that are allowed at the terminals 12 and 13 and the expected temperature rating of circuit 38.

By working on leakage current reduction, the clock frequency can be reduced to a very low value when the operating conditions are favorable or can keep a high value if the circuit operates in worst case conditions. In one non-limiting example embodiment, the clock frequency varies from approximately three hundred fifty Kilohertz (350 kHz) at startup and adjusts down to approximately thirty five Kilohertz (35 kHz) when the gate capacitance of transistor 11 is fully charged, for example when the Vgs is no less than the first threshold value. Greater power saving may be possible if the input voltage (Vin) is higher or if leakage currents are very low. The steady state power consumption can be close to those of P-channel MOS transistors (μA range) which may be an improvement of up to fifty to one over prior methods of driving N-channel MOS transistors.

The configuration of circuit 10 and/or circuit 40 assists in reducing the power consumption of N-channel MOS based switches or N-channel MOS power management devices such as voltage regulators or battery chargers. There may be minimized power loss in voltage clamp and other gate protection circuits. The circuit for monitoring the Vgs may be very simple. In one example embodiment, the feedback signal may be a current formed by a zener diode and a P-channel MOS transistor. In one non-limiting example embodiment, the VFO may be controlled by a current (for example a current of approximately 50 nA) which flows through a zener diode when the gate voltage has reached the first threshold value. In one embodiment, the voltage source used for the second threshold value, such as reference 46, may correspond to a Vgs of an N-channel MOS transistor.

Referring back to FIG. 3, three non-limiting example phases may be illustrated. When one of the example embodiments of circuit 18 and/or circuit 40 is enabled, the charge pump output signal increases when the transistor 11 Vgs increases. The charge pump output signal may be high enough to supply the current source but is not yet shorted to the gate. The operating frequency is maximum. In a non-limiting example embodiment of the second phase, the Vgs transistor 11 keeps increasing to reduce the on-resistance of transistor 11, and the charge pump output is directly connected to the gate of transistor 11 responsively to Vgs having a value approximately no less than the second threshold voltage. In another non-limiting example embodiment of the second phase, the output voltage (Vo) has reached approximately Vin. Directly connecting the output of charge pump 27 to the gate of transistor 11 speeds up the gate charging and allows the charge-pump output voltage to be clamped at the same voltage as the gate. In a non-limiting example of the third phase, a feedback current starts flowing through the zener diode to adjust the frequency of the clock signal. In another embodiment, the feedback signal increases to reduce the clock frequency to a minimum value that causes the gate control circuit to supply a current to the gate of transistor 11 that does not increase the charge of the gate capacitance of transistor 11.

Figure 4:
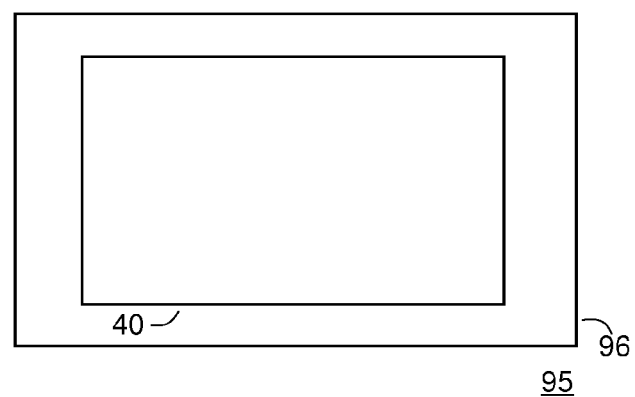
FIG. 4 illustrates an enlarged plan view of a semiconductor device that includes the adaptive MOS gate driver circuit of FIGS. 1 and/or 2 in accordance with the present invention.

FIG. 4 illustrates an enlarged plan view of a portion of an embodiment of a semiconductor device or integrated circuit 95 that is formed on a semiconductor die 96. In an embodiment, circuit 10 and/or circuit 38 may be formed on a semiconductor die. In an embodiment, transistor 11 may also be formed on the semiconductor die along with circuit 10 and/or circuit 38.

Circuit 10 and/or circuit 38 may be formed on die 96. Die 96 may also include other circuits that are not shown in FIG. 4 for simplicity of the drawing. Circuit(s) 10 or 38 and device or integrated circuit 95 are formed on die 96 by semiconductor manufacturing techniques that are well known to those skilled in the art.

For all of the foregoing, one skilled in the art will understand that in one embodiment, an adaptive MOS gate driver circuit may comprise: a gate control circuit configured to form a drive signal to drive a gate of an MOS transistor, for example a drive signal 20 to drive transistor 11; a variable frequency oscillator configured to form a clock signal and to adjust a frequency of the clock signal responsively to a difference between a Vgs of the MOS transistor and a first threshold value; a charge pump circuit configured to provide an output voltage and an output current to the gate control circuit wherein the value of one of the output voltage or the output current varies proportionally to variations of the frequency of the clock signal.

An embodiment may include that the gate control circuit may be configured to couple the output current from the charge pump to the gate of the MOS transistor responsively to the Vgs of the MOS transistor having a value greater than a second threshold value and to provide a current from a selectively enabled current source of the gate control circuit responsively to the Vgs of the MOS transistor having a value no greater than the second threshold value.

In an embodiment the variable frequency oscillator may be configured to form the output current from the charge pump to have a minimum value at a minimum frequency of the clock signal wherein the minimum value of the output current from the charge pump may be substantially equal to the leakage currents of circuit 55, such as for example the leakage current of circuit 18 and/or charge pump 27. A non-limiting example embodiment may include that the output current has a value that includes any leakage current that may be present in the MOS transistor.

Another embodiment may include that the leakage current of the MOS transistor may be a leakage current at a minimum value of Vgs that maintains the MOS transistor in state to have drain-to-source current conduction above a drain-to-source leakage current of the MOS transistor.

Another embodiment may include that the leakage current of the MOS transistor may be a value of current that can be supplied to a gate of the MOS transistor without increasing a value of charge on a gate-to-source capacitance of the MOS transistor.

An embodiment may include that the leakage current of the MOS transistor may be a leakage current at a Vgs may be no less than a threshold voltage of the MOS transistor, such as a Vgs that causes conduction of the MOS transistor, at the value of drain-to-source current that may be current conducted by the MOS transistor.

An embodiment may include that the variable frequency oscillator may be configured to decrease the frequency of the clock signal responsively to the Vgs of the MOS transistor having a value that may be no less than the first threshold value.

An embodiment of the adaptive MOS gate driver circuit may include a means for varying the output current to drive the gate of the transistor responsively to the Vgs of the MOS transistor.

In an embodiment, the variable frequency oscillator may be configured to increase the frequency of the clock signal responsively to the Vgs of the MOS transistor having a value that may be less than the first threshold value.

An embodiment of a method of forming a gate driver circuit for an MOS transistor may comprise: configuring the gate driver circuit to form a drive current to supply to a gate of an MOS transistor wherein the value of the drive current is a minimum value that can be supplied to the gate without increasing a charge stored on a gate-to-source capacitance of the MOS transistor; and configuring the gate driver circuit to change the value of the drive current responsively to changes of a Vgs of the MOS transistor.

An embodiment of the method may include configuring the gate driver circuit to decrease the drive current responsively to an increase in the Vgs and to increase the drive current responsively to a decrease of the Vgs.

The method may have an embodiment that may include configuring the gate driver circuit to decrease the drive current responsively to the Vgs of the MOS transistor having a value greater than a threshold value and to increase the drive current responsively to the Vgs of the MOS transistor having a value no greater than the threshold value.

An embodiment of the method may include forming a variable frequency oscillator of the gate driver circuit to form a clock single having a frequency that varies responsively to variations of the Vgs of the MOS transistor.

Those skilled in the art will appreciate that an embodiment of an adaptive MOS gate driver circuit may comprise:

a gate control circuit, such as for example circuit 18, configured to form a drive signal to drive a gate of an MOS transistor, for example transistor 11;

a variable frequency oscillator configured to form a clock signal, for example the CK signal, and to adjust a frequency of the clock signal responsively to a difference between a Vgs of the MOS transistor and a first threshold value, a threshold of circuit 55 for a non-limiting example; and a charge pump circuit, for example circuit 27, configured to provide an output voltage, for example voltage EV, and an output current, for example current 29, to the gate control circuit wherein a value of the output current varies proportionally to variations of the frequency of the clock signal.

In another embodiment, the gate control circuit may be configured to couple the output current from the charge pump circuit to the gate of the MOS transistor responsively to the Vgs of the MOS transistor having a value greater than a second threshold value, ref 46 for a non-limiting example, and to provide a current from a selectively enabled current source, source 44 for example, of the gate control circuit responsively to the Vgs of the MOS transistor having a value no greater than the second threshold value.

An embodiment may include that the variable frequency oscillator may be configured to form the output current from the charge pump circuit to have a minimum value at a minimum frequency of the clock signal wherein the minimum value of the output current from the charge pump circuit is substantially equal to a leakage current of the MOS transistor.

In an embodiment the leakage current of the MOS transistor may be a leakage current at a minimum value of Vgs that maintains the MOS transistor in state to have drain-to-source current conduction above a drain-to-source leakage current of the MOS transistor.

An embodiment may include that the leakage current of the MOS transistor may be a value of current that can be supplied to a gate of the MOS transistor without increasing a value of charge on a gate-to-source capacitance of the MOS transistor.

In another embodiment, the leakage current of the MOS transistor may be a leakage current at a Vgs that is no less than a threshold voltage of the MOS transistor at the value of drain-to-source current that is current conducted by the MOS transistor.

For an embodiment the variable frequency oscillator may be configured to decrease the frequency of the clock signal responsively to the Vgs of the MOS transistor having a value that is no less than the first threshold value.

An embodiment may include that the variable frequency oscillator may be configured to increase the frequency of the clock signal responsively to the Vgs of the MOS transistor having a value that is less than the first threshold value.

An embodiment may include a means for varying the output current to drive the gate of the transistor responsively to the Vgs of the MOS transistor.

Those skilled in the art will appreciate that an embodiment of a method of forming a gate driver circuit for an MOS transistor, such as transistor 11 for example, may comprise:

configuring the gate driver circuit, such as circuit 38 in a non-limiting example, to form a drive current, such as current 48 for example, to supply to a gate of an MOS transistor wherein a value of the drive current is a minimum value that can be supplied to the gate without increasing a charge stored on a gate-to-source capacitance of the MOS transistor; and configuring the gate driver circuit to change the value of the drive current responsively to changes of a Vgs of the MOS transistor.

An embodiment of the method may include configuring the gate driver circuit to decrease the drive current responsively to an increase in the Vgs and to increase the drive current responsively to a decrease of the Vgs.

In an embodiment, the method may include configuring the gate driver circuit to decrease the drive current responsively to the Vgs of the MOS transistor having a value greater than a threshold value and to increase the drive current responsively to the Vgs of the MOS transistor having a value no greater than the threshold value.

Another embodiment may include forming a variable frequency oscillator of the gate driver circuit form a clock single having a frequency that varies responsively to variations of the Vgs of the MOS transistor.

Those skilled in the art will appreciate that an embodiment of a method of forming a gate driver circuit for an MOS transistor may comprise:

configuring the gate driver circuit to form a drive current, for example current 29, to supply to a gate of an MOS transistor; and configuring the gate driver circuit, circuits 10 or 38 for example, to change the value of the drive current responsively to changes of a Vgs of the MOS transistor.

An embodiment of the method may include configuring a charge pump circuit (27) to form the value of the drive current (29) responsively to a value of the Vgs of the transistor.

Another embodiment of the method may include configuring the gate driver circuit to change the value of the drive current after the Vgs has a value no less than a first threshold value, for example the value represented by circuit 55.

In another embodiment the method may include configuring the gate driver circuit to change the value of the drive current after the Vgs has a value no less than a second threshold value, such as for example the value from circuit 47, wherein the second threshold value is less than the first threshold value.

For an embodiment, the method may include configuring the charge pump circuit to form the value of the drive current responsively to a frequency of a clock signal, for example signal 25.

An embodiment of the method may include configuring the gate driver circuit to change the frequency of the clock signal responsively to the value of the Vgs of the transistor.

Another embodiment of the method may include configuring the gate driver circuit (40) to change the value of the drive current inversely to the change in the Vgs of the transistor.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art. For example, the methods are described in relation to a series pass transistor but the method and apparatus may also be applicable to switched transistors. For example, in an embodiment as the switching DC-DC converter frequency is higher than or equal to the power MOS switching frequency, the power device, such as for example transistor 11, may be switched on with a delay compatible with power MOS own switching period or alternately with a small flying capacitor in case the switching DC-DC converter is a charge-pump. If the DC-DC converter has same frequency as the power MOS, the charge-pump's flying capacitor must be big enough to immediately charge the power MOS gate. In another embodiment, a reservoir capacitor can be connected to the DC-DC converter's output to provide a low output impedance internal supply voltage, which can be used to charge the power MOS gate, such as for example transistor 11, through an additional switch. The discharge of the gate may be done by another switch.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. An adaptive MOS gate driver circuit comprising:
   a gate control circuit configured to form a drive signal to drive a gate of an MOS transistor;
   a variable frequency oscillator configured to form a clock signal and to adjust a frequency of the clock signal responsively to a difference between a Vgs of the MOS transistor and a first threshold value;
   a charge pump circuit configured to provide an output voltage and an output current to the gate control circuit wherein a value of the output current varies proportionally to variations of the frequency of the clock signal; and
   the gate control circuit configured to couple the output current from the charge pump circuit to the gate of the MOS transistor responsively to the Vgs of the MOS transistor having a value greater than a second threshold value and to provide a current from a selectively enabled current source of the gate control circuit responsively to the Vgs of the MOS transistor having a value no greater than the second threshold value.

2. The adaptive MOS gate driver circuit of claim 1 wherein the variable frequency oscillator is configured to form the output current from the charge pump circuit to have a minimum value at a minimum frequency of the clock signal wherein the minimum value of the output current from the charge pump circuit is substantially equal to a leakage current of the MOS transistor.

3. The adaptive MOS gate driver circuit of claim 2 wherein the leakage current of the MOS transistor is a leakage current at a minimum value of Vgs that maintains the MOS transistor in state to have drain-to-source current conduction above a drain-to-source leakage current of the MOS transistor.

4. The adaptive MOS gate driver circuit of claim 2 wherein the leakage current of the MOS transistor is a value of current that can be supplied to a gate of the MOS transistor without increasing a value of charge on a gate-to-source capacitance of the MOS transistor.

5. The adaptive MOS gate driver circuit of claim 2 wherein the leakage current of the MOS transistor is a leakage current at a Vgs that is no less than a threshold voltage of the MOS transistor at the value of drain-to-source current that is current conducted by the MOS transistor.

6. The adaptive MOS gate driver circuit of claim 1 wherein the variable frequency oscillator is configured to decrease the frequency of the clock signal responsively to the Vgs of the MOS transistor having a value that is no less than the first threshold value.

7. The adaptive MOS gate driver circuit of claim 1 wherein the variable frequency oscillator is configured to increase the frequency of the clock signal responsively to the Vgs of the MOS transistor having a value that is less than the first threshold value.

8. The adaptive MOS gate driver circuit of claim 1 further including a means for varying the output current to drive the gate of the transistor responsively to the Vgs of the MOS transistor.

9. A method of forming a gate driver circuit for an MOS transistor comprising:
   configuring the gate driver circuit to form a first drive current to supply to a gate of an MOS transistor;
   configuring the gate driver circuit to change the first drive current to a second drive current in response to a Vgs of the MOS transistor having a value that is no less than a second threshold value; and
   configuring the gate driver circuit to change a value of the second drive current responsively to changes of the Vgs for values of the Vgs that are no less than a first threshold value wherein the first threshold value is greater than the second threshold value.

10. The method of claim 9 wherein configuring the gate driver circuit to change the value of the second drive current responsively to changes of a Vgs of the MOS transistor includes configuring the gate driver circuit to decrease the second drive current responsively to an increase in the Vgs and to increase the second drive current responsively to a decrease of the Vgs.

11. The method of claim 10 wherein configuring the gate driver circuit to decrease the second drive current responsively to the increase in the Vgs and to increase the second drive current responsively to the decrease of the Vgs includes configuring the gate driver circuit to decrease the second drive current responsively to the Vgs of the MOS transistor having the value greater than the first threshold value and to increase the drive current responsively to the Vgs of the MOS transistor having the value no greater than the first threshold value.

12. The method of claim 9 further including forming a variable frequency oscillator of the gate driver circuit form a clock signal having a frequency that varies responsively to variations of the Vgs of the MOS transistor.

13. The method of claim 9 wherein configuring the gate driver circuit to form the drive current includes configuring a current source circuit to form the first drive current to supply to the gate of the MOS transistor responsively to the Vgs value less than the second threshold value; and
   configuring the gate driver circuit to terminate the first drive current and form the second drive current to supply to the gate responsively to the Vgs having the value less than the first threshold value and no less than the second threshold value, and to control the value of the second drive current responsively to the value of the Vgs for the Vg values that are no less the first threshold value.

14. A method of forming a gate driver circuit for an MOS transistor comprising:
   configuring the gate driver circuit to form a drive current to supply to a gate of an MOS transistor;
   configuring the gate driver circuit to change the drive current responsively to a Vgs of the MOS transistor having a value greater than a second threshold value and less than a first threshold value wherein the second threshold value is less than the first threshold value; and configuring the gate driver circuit to adjust the value of the drive current responsively to the value of the Vgs for Vgs values no less than the first threshold value.

15. The method of claim 14 further including configuring the gate driver circuit to couple a charge pump circuit to form the value of the drive current for the Vgs value greater than the second threshold value but not for the Vgs values less than the second threshold value.

16. The method of claim 15 further including configuring the gate driver circuit to decouple the charge pump circuit from supplying the drive current responsively to the Vgs value less than the second threshold value.

17. The method of claim 15 further including configuring the gate driver circuit to change the value of the drive current after the Vgs has a value no less than the second threshold value.

18. The method of claim 14 wherein configuring the gate driver circuit to adjust the value of the drive current includes configuring the gate driver circuit to change the value of the drive current inversely to the change in the Vgs of the transistor.

19. The method of claim 14 further including configuring the gate driver circuit to form a first drive current to supply to a gate of an MOS transistor for Vgs values less than the second threshold value, and to form a second drive current and change the first drive current to a second drive current to supply to the gate responsively to the Vgs having the value no less than the second threshold value and less than the first threshold value.

20. The method of claim 14 further including configuring a charge pump circuit to form a first voltage;
coupling a current source circuit to receive the first voltage and form the drive current responsively to the Vgs having the value less than the second threshold value; and
configuring the gate driver circuit to couple the charge pump circuit to supply the drive current responsively to the Vgs values no less than the second threshold value.

* * * * *